United States Patent [19]
Wingen

[11] Patent Number: 5,754,614
[45] Date of Patent: May 19, 1998

[54] GRAY CODE COUNTER

[75] Inventor: Neal Wingen, Algonquin, Ill.

[73] Assignee: VLSI Technology, Inc., San Jose, Calif.

[21] Appl. No.: 833,360

[22] Filed: Apr. 3, 1997

[51] Int. Cl.[6] ............................................... H03K 21/00
[52] U.S. Cl. .......................... 377/34; 377/111; 377/114; 341/97; 341/98
[58] Field of Search ...................... 377/34, 111, 114; 326/62; 341/96–98

[56] References Cited

U.S. PATENT DOCUMENTS

| | | | |
|---|---|---|---|
| 3,588,461 | 6/1971 | Halsall | 377/34 |
| 4,618,849 | 10/1986 | Bruestle | 340/347 |
| 4,780,894 | 10/1988 | Watkins et al. | 377/34 |
| 4,975,698 | 12/1990 | Kagey | 341/98 |
| 5,045,854 | 9/1991 | Windmiller | 341/97 |
| 5,097,491 | 3/1992 | Hall | 377/34 |
| 5,164,968 | 11/1992 | Otto | 377/34 |
| 5,448,606 | 9/1995 | Snelgrove | 377/34 |

FOREIGN PATENT DOCUMENTS 0079829   5/1985   Japan ..................................... 341/98

*Primary Examiner*—Margaret Rose Wambach
*Attorney, Agent, or Firm*—Douglas L. Weller

[57] ABSTRACT

A Gray Code counter includes first translator logic, binary incrementing/decrementing logic, second translator logic, and a clocked storage device. The first translator logic receives at an input a Gray Code number, $I_{gray}[n:0]$ which the first translator translates into a binary number, $I_{bin}[n:0]$. The binary incrementing/decrementing logic either increments or decrements the binary number $I_{bin}[n:0]$ to produce an incremented/decremented binary number, $Z_{bin}[n:0]$. The second translator logic translates the incremented/decremented binary number $Z_{bin}[n:0]$ into an incremented/decremented Gray Code number, $Z_{gray}[n:0]$. The clocked storage device stores the incremented/decremented Gray Code number, $Z_{gray}[n:0]$. The clocked storage device also feeds the incremented/decremented Gray Code number, $Z_{gray}[n:0]$, to the input of the first translator logic.

18 Claims, 4 Drawing Sheets

GRAY CODE COUNTER

BACKGROUND

The present invention relates to integrated circuit design and pertains particularly to the design of logic circuitry which use a Gray Code.

Gray Code sequences have the characteristic that there is only one bit difference between adjacent numbers in a sequence. This is advantageous in the design of certain logical circuits.

For example, counters are used extensively in the design of computers and other digital systems. Binary counters count up or down in accordance with normal binary sequences. Adjacent numbers in the normal binary sequence, however, often differ in multiple bits. When counting, the simultaneous transition of a large number of bits can increase the risk of transition errors or glitches. In addition, the simultaneous transition of a large number of bits can increase the electrical noise generated by the logical circuitry.

In order to avoid the problems with binary counters, Gray Code counters are often used. See for example, U.S. Pat. No. 5,448,606 issued to Andrew H. Snelgrove, for Gray Code Counter; U.S. Pat. No. 5,164,968 issued to Kurt J. Otto, for Nine-Bit Gray Code Generator; U.S. Pat. No. 5,097,491 issued to Christopher M. Hall, for Modular Gray Code Counter; U.S. Pat. No. 4,780,894 issued to Daniel Watkins et al., for N-Bit Gray Code Counter; and, U.S. Pat. No. 4,618,849 issued to John H. Bruestle, for Gray Code Counter. Because there is only one bit difference between adjacent numbers in a Gray Code sequence, when counting using a Gray Code counters, only one bit transitions between counts. This limits the potential for transition errors as well as limits the electrical noise generated.

Gray Code counters have the disadvantage of being generally more complex than ordinary binary counters. This increase in complexity can increase the design and manufacturing cost of circuitry which uses Gray Code counters.

SUMMARY OF THE INVENTION

In accordance with the preferred embodiment of the present invention, a Gray Code counter is set out. The Gray Code counter includes first translator logic, binary incrementing/decrementing logic, second translator logic, and a clocked storage device. The first translator logic receives at an input a Gray Code number, $I_{gray}[n:0]$ which the first translator translates into a binary number, $I_{bin}[n:0]$. The binary incrementing/decrementing logic either increments or decrements the binary number $I_{bin}[n:0]$ to produce an incremented/decremented binary number, $Z_{bin}[n:0]$. The second translator logic translates the incremented/decremented binary number $Z_{bin}[n:0]$ into an incremented/decremented Gray Code number, $Z_{gray}[n:0]$. The clocked storage device stores the incremented/decremented Gray Code number, $Z_{gray}[n:0]$. The clocked storage device also feeds the incremented/decremented Gray Code number, $Z_{gray}[n:0]$, to the input of the first translator logic.

For example, in the preferred embodiment of the present invention, the first translator logic translates the Gray Code number $I_{gray}[n:0]$ into the binary number $I_{bin}[n:0]$ according to the following logic algorithm:

$$I_{bin}[n:0]=I_{gray}[n:0] \text{ XOR } \{0,I_{bin}[n:1]\}.$$

Similarly, in the preferred embodiment of the present invention, the second translator logic translates the incremented/decremented binary number $Z_{bin}[n:0]$ into the incremented/decremented Gray Code number $Z_{gray}[n:0]$ according to the following logic algorithm:

$$Z_{gray}[n:0]=Z_{bin}[n:0] \text{ XOR } \{0,Z_{bin}[n:1]\}.$$

The present invention provides for a Gray Code counter which is easy to describe in a hardware design language. An algorithm for implementation of a Gray Code counter in accordance with the preferred embodiment of the present invention is significantly shorter than algorithms used to implement Gray Code counters in accordance with the prior art.

DESCRIPTION OF THE PREFERRED EMBODIMENT

Figure 1:
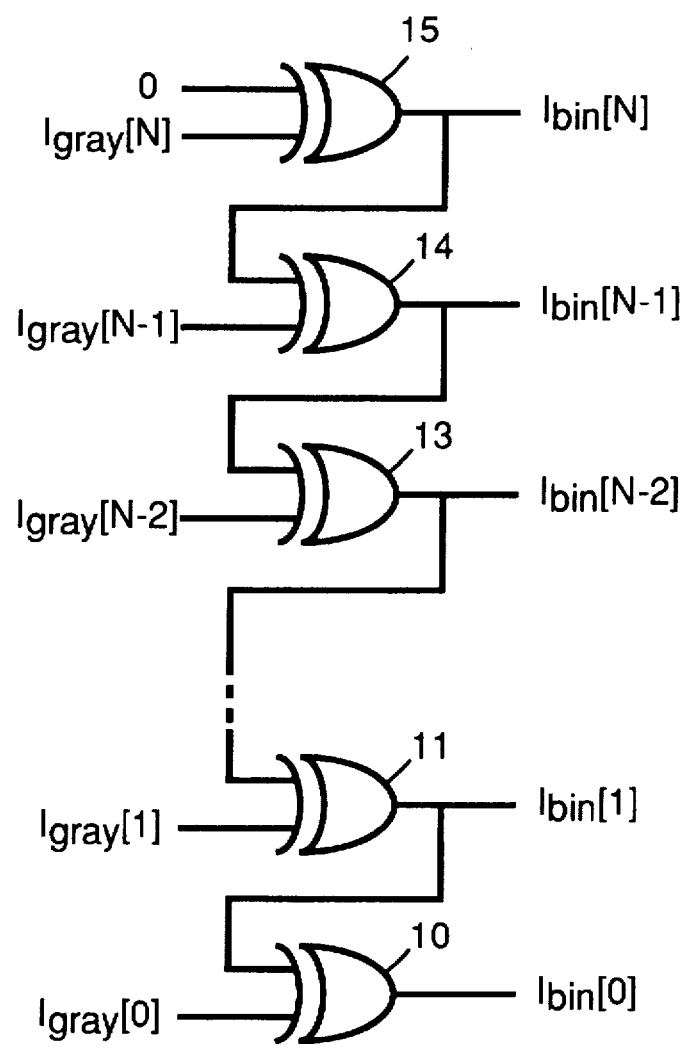
FIG. 1 shows logic which transforms a binary number to a Gray Code number in accordance with a preferred embodiment of the present invention.

FIG. 1 shows logic which transforms a Gray Code number, $I_{gray}[n:0]$, to a binary number, $I_{bin}[n:0]$. A logic XOR gate 15 combines 0 and the highest order bit of the Gray Code number, $I_{gray}[n]$, to produce the highest order bit of the binary number, $I_{bin}[n]$. The logical algorithm implemented by XOR gate 15 is as follows:

$$I_{bin}[n]=I_{gray}[n] \text{ XOR } 0.$$

This logical algorithm may be implemented using simplified logic allowing for logic XOR gate 15 to be eliminated. This is because the above logical algorithm is equivalent to the following:

$$I_{bin}[n]=I_{gray}[n].$$

A logic XOR gate 14 combines the highest order bit of the binary number, $I_{bin}[n]$ and the second highest order bit of the Gray Code number, $I_{gray}[n-1]$, to produce the second highest order bit of the binary number, $I_{bin}[n-1]$. The logical algorithm implemented by XOR gate 14 is as follows:

$$I_{bin}[n-1]=I_{gray}[n-1] \text{ XOR } I_{bin}[n].$$

A logic XOR gate 13 combines the second highest order bit of the binary number, $I_{bin}[n-1]$ and the third highest order bit of the Gray Code number, $I_{gray}[n-2]$, to produce the third highest order bit of the binary number, $I_{bin}[n-2]$. The logical algorithm implemented by XOR gate 13 is as follows:

$$I_{bin}[n-2]=I_{gray}[n-2] \text{ XOR } I_{bin}[n-1].$$

This pattern proceeds until the lowest order bit. For example, a logic XOR gate 11 combines the third lowest order bit of the binary number, $I_{bin}[2]$ and the second lowest order bit of the Gray Code number, $I_{gray}[1]$, to produce the second lowest order bit of the binary number, $I_{bin}[1]$. The logical algorithm implemented by XOR gate 11 is as follows:

$I_{bin}[1]=I_{gray}[1]\ XOR\ I_{bin}[2]$.

A logic XOR gate 10 combines the second lowest order bit of the binary number, $I_{bin}[1]$ and the lowest order bit of the Gray Code number, $I_{gray}[0]$, to produce the second lowest order bit of the binary number, $I_{bin}[0]$. The logical algorithm implemented by XOR gate 10 is as follows:

$I_{bin}[0]=I_{gray}[0]\ XOR\ I_{bin}[1]$.

The transformation performed by the circuitry shown in FIG. 1 may be described by the logical algorithm set out below:

$I_{bin}[n:0]=I_{gray}[n:0]\ XOR\ \{0,I_{bin}[n:1]\}$

Figure 2:
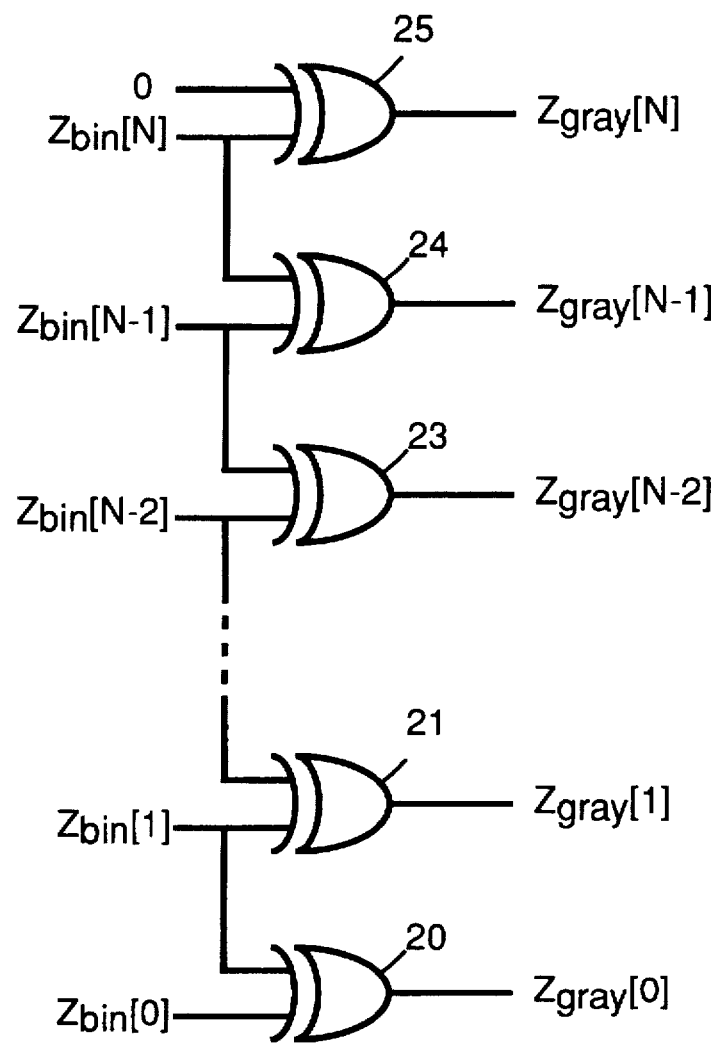
FIG. 2 shows logic which transforms a Gray Code number to a binary number in accordance with a preferred embodiment of the present invention.

FIG. 2 shows logic which transforms a binary number, $Z_{bin}[n:0]$, to a Gray Code number, $Z_{gray}[n:0]$. A logic XOR gate 25 combines 0 and the highest order bit of the binary number, $Z_{bin}[n]$, to produce the highest order bit of the Gray Code number, $Z_{gray}[n]$. The logical algorithm implemented by XOR gate 25 is as follows:

$Z_{gray}[n]=Z_{bin}[n]\ XOR\ 0$.

This logical algorithm may be implemented using simplified logic allowing for logic XOR gate 25 to be eliminated. This is because the above logical algorithm is equivalent to the following::

$Z_{gray}[n]=Z_{bin}[n]$.

A logic XOR gate 24 combines the highest order bit of the binary number, $Z_{bin}[n]$ and the second highest order bit of the binary number, $Z_{bin}[n-1]$, to produce the second highest order bit of the Gray Code number, $Z_{gray}[n-1]$. The logical algorithm implemented by XOR gate 24 is as follows:

$Z_{gray}[n-1]=Z_{bin}[n-1]\ XOR\ Z_{bin}[n]$.

A logic XOR gate 23 combines the second highest order bit of the binary number, $Z_{bin}[n-1]$ and the third highest order bit of the binary number, $Z_{bin}[n-2]$, to produce the third highest order bit of the Gray Code number, $Z_{gray}[n-2]$. The logical algorithm implemented by XOR gate 23 is as follows:

$Z_{gray}[n-2]=Z_{bin}[n-2]\ XOR\ Z_{bin}[n-1]$.

This pattern proceeds until the lowest order bit. For example, a logic XOR gate 21 combines the third lowest order bit of the binary number, $Z_{bin}[2]$ and the second lowest order bit of the binary number, $Z_{bin}[1]$, to produce the second lowest order bit of the Gray Code number, $Z_{gray}[1]$. The logical algorithm implemented by XOR gate 21 is as follows:

$Z_{gray}[1]=Z_{bin}[1]\ XOR\ Z_{bin}[2]$.

A logic XOR gate 20 combines the second lowest order bit of the binary number, $Z_{bin}[1]$ and the lowest order bit of the binary number, $Z_{bin}[0]$, to produce the second lowest order bit of the Gray Code number, $Z_{gray}[0]$. The logical algorithm implemented by XOR gate 20 is as follows:

$Z_{gray}[0]=Z_{bin}[0]\ XOR\ Z_{bin}[1]$.

The transformation performed by the circuitry shown in FIG. 2 may be described by the logical algorithm set out below:

$Z_{gray}[n:0]=Z_{bin}[n:0]\ XOR\ \{0,Z_{bin}[n:1]\}$

Table 1 below sets out the translations between a five-bit (N=4) binary sequence to a five-bit (N=4) Gray Code using the logic pattern shown in FIG. 1 and FIG. 2:

TABLE 1

| Binary Number | | | | | Gray Code Number | | | | |
|---|---|---|---|---|---|---|---|---|---|
| 0 | 0 | 0 | 0 | 0 | 0 | 0 | 0 | 0 | 0 |
| 0 | 0 | 0 | 0 | 1 | 0 | 0 | 0 | 0 | 1 |
| 0 | 0 | 0 | 1 | 0 | 0 | 0 | 0 | 1 | 1 |
| 0 | 0 | 0 | 1 | 1 | 0 | 0 | 0 | 1 | 0 |
| 0 | 0 | 1 | 0 | 0 | 0 | 0 | 1 | 1 | 0 |
| 0 | 0 | 1 | 0 | 1 | 0 | 0 | 1 | 1 | 1 |
| 0 | 0 | 1 | 1 | 0 | 0 | 0 | 1 | 0 | 1 |
| 0 | 0 | 1 | 1 | 1 | 0 | 0 | 1 | 0 | 0 |
| 0 | 1 | 0 | 0 | 0 | 0 | 1 | 1 | 0 | 0 |
| 0 | 1 | 0 | 0 | 1 | 0 | 1 | 1 | 0 | 1 |
| 0 | 1 | 0 | 1 | 0 | 0 | 1 | 1 | 1 | 1 |
| 0 | 1 | 0 | 1 | 1 | 0 | 1 | 1 | 1 | 0 |
| 0 | 1 | 1 | 0 | 0 | 0 | 1 | 0 | 1 | 0 |
| 0 | 1 | 1 | 0 | 1 | 0 | 1 | 0 | 1 | 1 |
| 0 | 1 | 1 | 1 | 0 | 0 | 1 | 0 | 0 | 1 |
| 0 | 1 | 1 | 1 | 1 | 0 | 1 | 0 | 0 | 0 |
| 1 | 0 | 0 | 0 | 0 | 1 | 1 | 0 | 0 | 0 |
| 1 | 0 | 0 | 0 | 1 | 1 | 1 | 0 | 0 | 1 |
| 1 | 0 | 0 | 1 | 0 | 1 | 1 | 0 | 1 | 1 |
| 1 | 0 | 0 | 1 | 1 | 1 | 1 | 0 | 1 | 0 |
| 1 | 0 | 1 | 0 | 0 | 1 | 1 | 1 | 1 | 0 |
| 1 | 0 | 1 | 0 | 1 | 1 | 1 | 1 | 1 | 1 |
| 1 | 0 | 1 | 1 | 0 | 1 | 1 | 1 | 0 | 1 |
| 1 | 0 | 1 | 1 | 1 | 1 | 1 | 1 | 0 | 0 |
| 1 | 1 | 0 | 0 | 0 | 1 | 0 | 1 | 0 | 0 |
| 1 | 1 | 0 | 0 | 1 | 1 | 0 | 1 | 0 | 1 |
| 1 | 1 | 0 | 1 | 0 | 1 | 0 | 1 | 1 | 1 |
| 1 | 1 | 0 | 1 | 1 | 1 | 0 | 1 | 1 | 0 |
| 1 | 1 | 1 | 0 | 0 | 1 | 0 | 0 | 1 | 0 |
| 1 | 1 | 1 | 0 | 1 | 1 | 0 | 0 | 1 | 1 |
| 1 | 1 | 1 | 1 | 0 | 1 | 0 | 0 | 0 | 1 |
| 1 | 1 | 1 | 1 | 1 | 1 | 0 | 0 | 0 | 0 |

Figure 3:
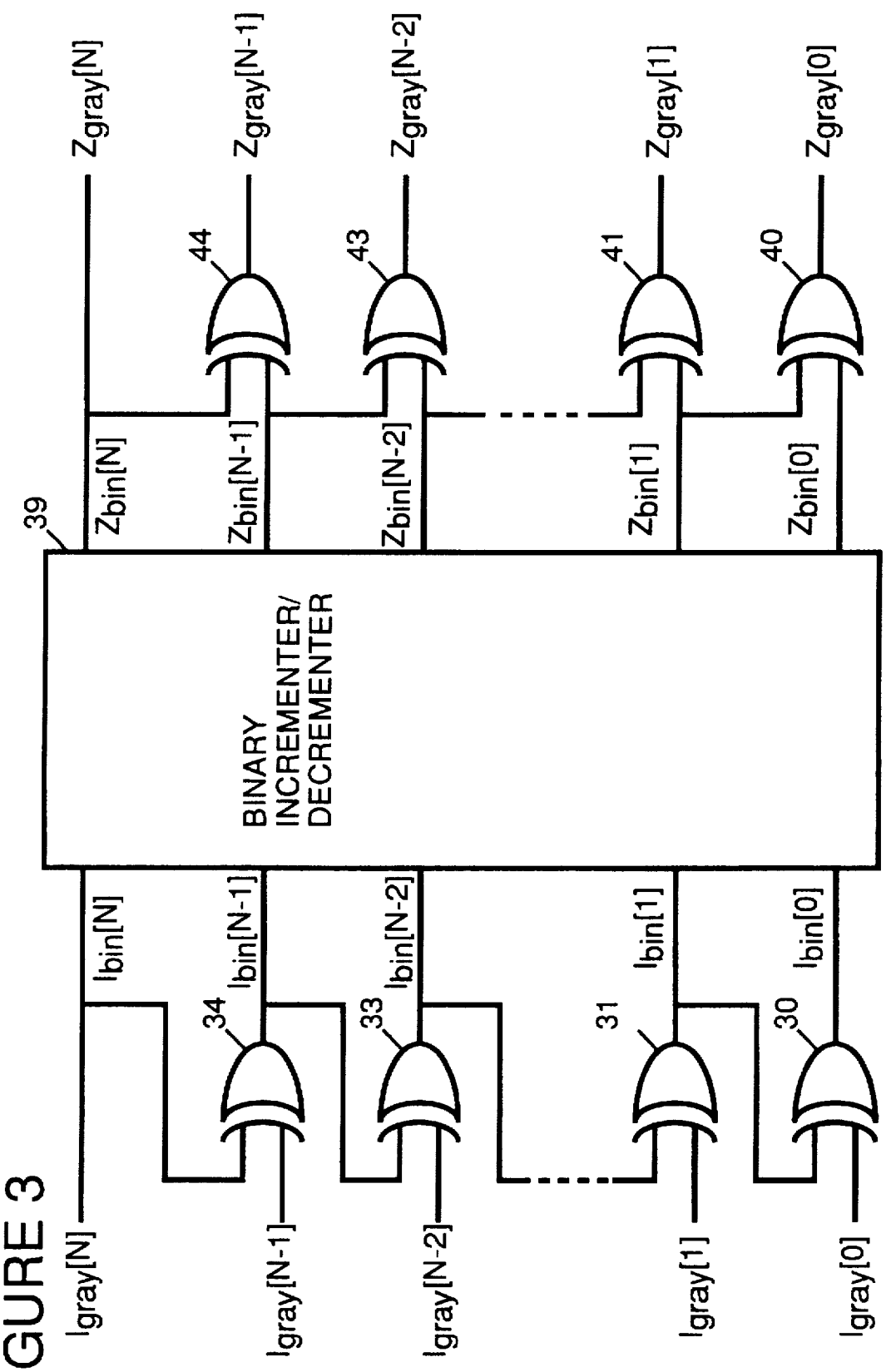
FIG. 3 shows logic which implements a Gray Code incrementer in accordance with a preferred embodiment of the present invention.

FIG. 3 shows an incrementer for a Gray Code sequence in accordance with a preferred embodiment of the present invention. A binary incrementer/decrementer 39 performs an increment or a decrement on a binary number. When incrementer/decrementer 39 functions as an incrementer, a binary number, $I_{bin}[n:0]$, is incremented to produce a binary number, $Z_{bin}[n:0]$, as set out below:

$Z_{bin}[n:0]=I_{bin}[n:0]+1$.

In this case, the Gray Code incrementer/decrementer shown in FIG. 3 functions as an incrementer to increment the Gray Code number $I_{gray}[n:0]$ to produce the incremented Gray Code number $Z_{gray}[n:0]$ in accordance with the logic algorithm set out below:

$Z_{gray}[n:0]=I_{gray}[n:0]+1$.

When incrementer/decrementer 39 functions as a decrementer, a binary number, $I_{bin}[n:0]$, is decremented to produce a binary number, $Z_{bin}[n:0]$, as set out below:

$Z_{bin}[n:0]=I_{bin}[n:0]-1$.

In this case, the Gray Code incrementer/decrementer shown in FIG. 3 functions as a decrementer to decrement the Gray Code number $I_{gray}[n:0]$ to produce the decremented Gray Code number $Z_{gray}[n:0]$ in accordance with the logic algorithm set out below:

$Z_{gray}[n:0]=I_{gray}[n:0]-1$.

At the input of binary incrementer/decrementer 39, logic transforms a Gray Code number, $I_{gray}[n:0]$, to binary number, $I_{bin}[n:0]$. The highest order bit of the Gray Code number, $I_{gray}[n]$, is used to produce the highest order bit of the binary number, $I_{bin}[n]$. The logical algorithm used is as follows:

$$I_{bin}[n]=I_{gray}[n].$$

A logic XOR gate 34 combines the highest order bit of the binary number, $I_{bin}[n]$ and the second highest order bit of the Gray Code number, $I_{gray}[n-1]$, to produce the second highest order bit of the binary number, $I_{bin}[n-1]$. The logical algorithm implemented by XOR gate 34 is as follows:

$$I_{bin}[n-1]=I_{gray}[n-1] \text{ XOR } I_{bin}[n].$$

A logic XOR gate 33 combines the second highest order bit of the binary number, $I_{bin}[n-1]$ and the third highest order bit of the Gray Code number, $I_{gray}[n-2]$, to produce the third highest order bit of the binary number, $I_{bin}[n-2]$. The logical algorithm implemented by XOR gate 33 is as follows:

$$I_{bin}[n-2]=I_{gray}[n-2] \text{ XOR } I_{bin}[n-1].$$

This pattern proceeds until the lowest order bit. For example, a logic XOR gate 31 combines the third lowest order bit of the binary number, $I_{bin}[2]$ and the second lowest order bit of the Gray Code number, $I_{gray}[1]$, to produce the second lowest order bit of the binary number, $I_{bin}[1]$. The logical algorithm implemented by XOR gate 31 is as follows:

$$I_{bin}[1]=I_{gray}[2] \text{ XOR } I_{bin}[2].$$

A logic XOR gate 30 combines the second lowest order bit of the binary number, $I_{bin}[1]$ and the lowest order bit of the Gray Code number, $I_{gray}[0]$, to produce the second lowest order bit of the binary number, $I_{bin}[0]$. The logical algorithm implemented by XOR gate 30 is as follows:

$$I_{bin}[0]=I_{gray}[0] \text{ XOR } I_{bin}[1].$$

At the output of binary incrementer/decrementer 39, logic transforms logic transforms the binary number $I_{bin}[n:0]$ to a Gray Code number, $Z_{gray}[n:0]$. The highest order bit of the binary number, $Z_{bin}[n]$, is used to produce the highest order bit of the Gray Code number, $Z_{gray}[n]$. The logical algorithm used is as follows:

$$Z_{gray}[n]=Z_{bin}[n].$$

A logic XOR gate 44 combines the highest order bit of the binary number, $Z_{bin}[n]$ and the second highest order bit of the binary number, $Z_{bin}[n-1]$, to produce the second highest order bit of the Gray Code number, $Z_{gray}[n-1]$. The logical algorithm implemented by XOR gate 44 is as follows:

$$Z_{gray}[n-1]=Z_{bin}[n-1] \text{ XOR } Z_{bin}[n].$$

A logic XOR gate 43 combines the second highest order bit of the binary number, $Z_{bin}[n-1]$ and the third highest order bit of the binary number, $Z_{bin}[n-2]$, to produce the third highest order bit of the Gray Code number, $Z_{gray}[n-2]$. The logical algorithm implemented by XOR gate 43 is as follows:

$$Z_{gray}[n-2]=Z_{bin}[n-2] \text{ XOR } Z_{bin}[n-1].$$

This pattern proceeds until the lowest order bit. For example, a logic XOR gate 41 combines the third lowest order bit of the binary number, $Z_{bin}[2]$ and the second lowest order bit of the binary number, $Z_{bin}[1]$, to produce the second lowest order bit of the Gray Code number, $Z_{gray}[1]$. The logical algorithm implemented by XOR gate 41 is as follows:

$$Z_{gray}[1]=Z_{bin}[1] \text{ XOR } Z_{bin}[2].$$

A logic XOR gate 40 combines the second lowest order bit of the binary number, $Z_{bin}[1]$ and the lowest order bit of the binary number, $Z_{bin}[0]$, to produce the second lowest order bit of the Gray Code number, $Z_{gray}[0]$. The logical algorithm implemented by XOR gate 40 is as follows:

$$Z_{gray}[0]=Z_{bin}[0] \text{ XOR } Z_{bin}[1].$$

Figure 4:
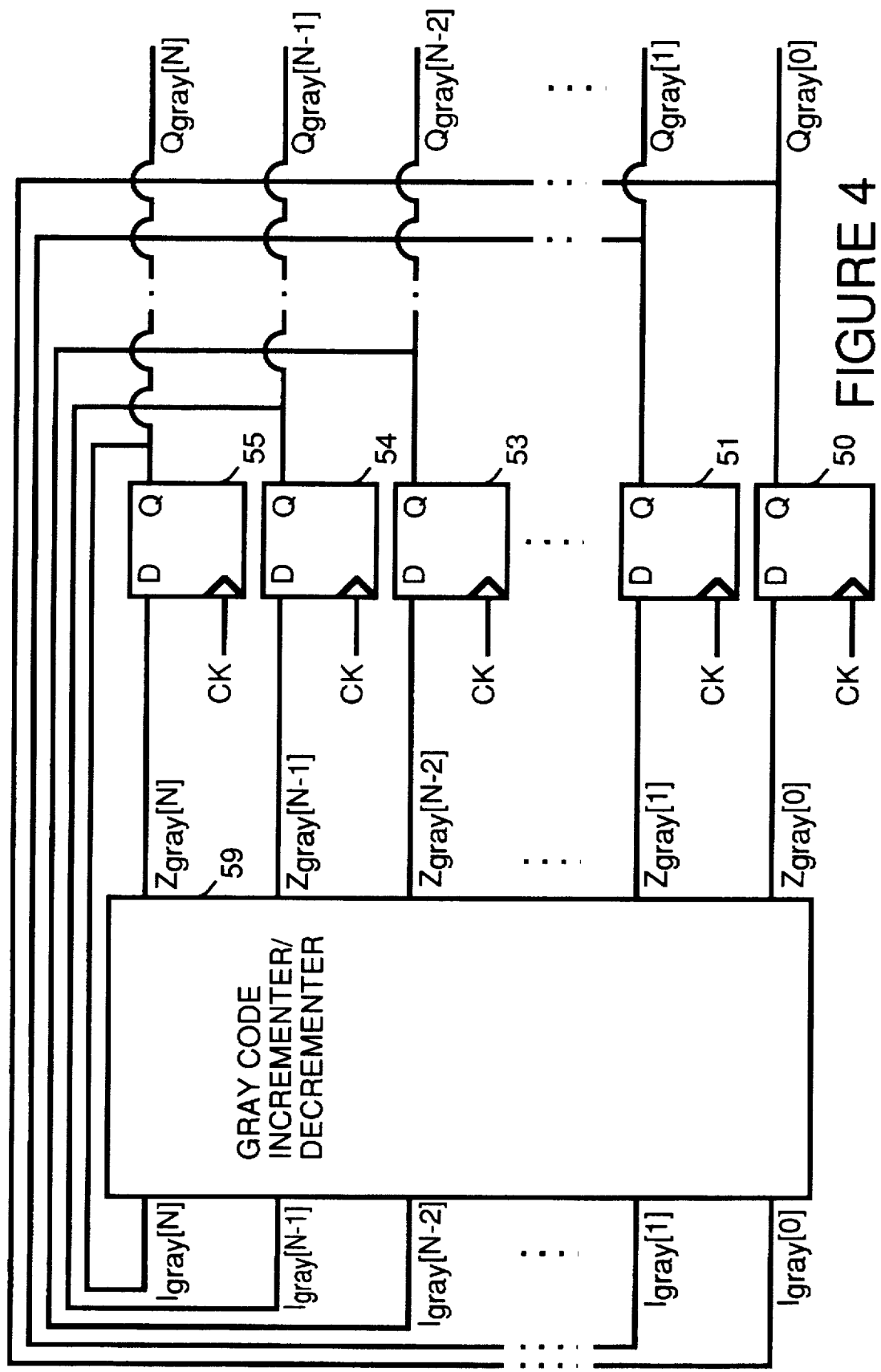
FIG. 4 shows logic which implements a Gray Code counter in accordance with a preferred embodiment of the present invention.

FIG. 4 shows logic which implements a Gray Code counter in accordance with a preferred embodiment of the present invention. A Gray Code incrementer/decrementer 59 is for example, the Gray Code incrementer/decrementer shown in FIG. 3. When Gray Code incrementer/decrementer 59 functions as an incrementer, the Gray Code number $I_{gray}[n:0]$ is incremented to produce the incremented Gray Code number $Z_{gray}[n:0]$ in accordance with the logic algorithm set out below:

$$Z_{gray}[n:0]=I_{gray}[n:0]+1.$$

When Gray Code incrementer/decrementer 59 functions as a decrementer, the Gray Code number $I_{gray}[n:0]$ is decremented to produce the decremented Gray Code number $Z_{gray}[n:0]$ in accordance with the logic algorithm set out below:

$$Z_{gray}[n:0]=I_{gray}[n:0]-1.$$

The output of Gray Code incrementer/decrementer 59 is stored in a register, implemented, for example, by a series of D flip-flops. A D flip-flop 55 stores bit $Z_{gray}[n]$ of the incremented Gray Code number $Z_{gray}[n:0]$. A D flip-flop 54 stores bit $Z_{gray}[n-1]$ of the incremented Gray Code number $Z_{gray}[n:0]$. A D flip-flop 53 stores $Z_{gray}[n-2]$ of the incremented Gray Code number $Z_{gray}[n:0]$. A D flip-flop 51 stores bit $Z_{gray}[1]$ of the incremented Gray Code number $Z_{gray}[n:0]$. A D flip-flop 50 stores bit $Z_{gray}[0]$ of the incremented Gray Code number $Z_{gray}[n:0]$. Each of the D flip-flops 50, 51, 53, 54 and 55 is clocked by a clock signal CK.

The output of D flip-flop 55 is bit $Q_{gray}[n]$ of the Gray Code counter output count $Q_{gray}[n:0]$. Bit $Q_{gray}[n]$ is fed back to the input of Gray Code incrementer/decrementer 59 and serves as bit $I_{gray}[n]$ for the next clock cycle.

The output of D flip-flop 54 is bit $Q_{gray}[n-1]$ of the Gray Code counter output count $Q_{gray}[n:0]$. Bit $Q_{gray}[n-1]$ is fed back to the input of Gray Code incrementer/decrementer 59 and serves as bit $I_{gray}[n-1]$ for the next clock cycle.

The output of D flip-flop 53 is bit $Q_{gray}[n-2]$ of the Gray Code counter output count $Q_{gray}[n:0]$. Bit $Q_{gray}[n-2]$ is fed back to the input of Gray Code incrementer/decrementer 59 and serves as bit $I_{gray}[n-2]$ for the next clock cycle.

The output of D flip-flop 51 is bit $Q_{gray}[2]$ of the Gray Code counter output count $Q_{gray}[n:0]$. Bit $Q_{gray}[1]$ is fed back to the input of Gray Code incrementer/decrementer 59 and serves as bit $I_{gray}[1]$ for the next clock cycle.

The output of D flip-flop 50 is bit $Q_{gray}[0]$ of the Gray Code counter output count $Q_{gray}[n:0]$. Bit $Q_{gray}[0]$ is fed back to the input of Gray Code incrementer/decrementer 59 and serves as bit $I_{gray}[0]$ for the next clock cycle.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. An incrementer which increments a Gray Code number $I_{gray}[n:0]$ to produce an incremented Gray Code number $Z_{gray}[n:0]$, the incrementer comprising:

first translator logic which translates the Gray Code number $I_{gray}[n:0]$ into a binary number $I_{bin}[n:0]$ according to the following logic algorithm:

$$I_{bin}[n:0]=I_{gray}[n:0] \text{ XOR } \{0,I_{bin}[n:1])\}$$

binary incrementing logic which increments the binary number $I_{bin}[n:0]$ to produce an incremented binary number $Z_{bin}[n:0]$ according to the following logic algorithm:

$$Z_{bin}[n:0]=I_{bin}[n:0]+1;$$

and, second translator logic which translates the incremented binary number $Z_{bin}[n:0]$ into the incremented Gray Code number $Z_{gray}[n:0]$ according to the following logic algorithm:

$$Z_{gray}[n:0]=Z_{bin}[n:0] \text{ XOR } \{0,Z_{bin}[n:1]\}.$$

2. A decrementer which decrements a Gray Code number $I_{gray}[n:0]$ to produce a decremented Gray Code number $Z_{gray}[n:0]$, the decrementer comprising:

first translator logic which translates the Gray Code number $I_{gray}[n:0]$ into a binary number $I_{bin}[n:0]$ according to the following logic algorithm:

$$I_{bin}[n:0]=I_{gray}[n:0] \text{ XOR } \{0,I_{bin}[n:1]\};$$

binary decrementing logic which decrements the binary number $I_{bin}[n:0]$ to produce a decremented binary number $Z_{bin}[n:0]$ according to the following logic algorithm:

$$Z_{bin}[n:0]=I_{bin}[n:0]-1;$$

and, second translator logic which translates the decremented binary number $Z_{bin}[n:0]$ into the decremented Gray Code number $Z_{gray}[n:0]$ according to the following logic algorithm:

$$Z_{gray}[n:0]=Z_{bin}[n:0] \text{ XOR } \{0,Z_{bin}[n:1]\}.$$

3. A Gray Code counter comprising:

first translator logic which receives at an input a Gray Code number, $I_{gray}[n:0]$ which the first translator translates into a binary number, $I_{bin}[n:0]$;

binary incrementing logic which increments the binary number $I_{bin}[n:0]$ to produce an incremented binary number, $Z_{bin}[n:0]$;

second translator logic which translates the incremented binary number $Z_{bin}[n:0]$ into an incremented Gray Code number, $Z_{gray}[n:0]$; and, clocked storage device, coupled to the second translator logic, which stores the incremented Gray Code number, $Z_{gray}[n:0]$, the clocked storage device feeding the incremented Gray Code number, $Z_{gray}[n:0]$, to the input of the first translator logic.

4. A Gray Code counter as in claim 3 wherein the clocked storage device is implemented using a plurality of D flip-flops.

5. A Gray Code counter as in claim 3 wherein the first translator logic translates the Gray Code number $I_{gray}[n:0]$ into the binary number $I_{bin}[n:0]$ according to the following logic algorithm:

$$I_{bin}[n:0]=I_{gray}[n:0] \text{ XOR } \{0,I_{bin}[n:1]\}.$$

6. A Gray Code counter as in claim 3 wherein the second translator logic translates the incremented binary number $Z_{bin}[n:0]$ into the incremented Gray Code number $Z_{gray}[n:0]$ according to the following logic algorithm:

$$Z_{gray}[n:0]=Z_{bin}[n:0] \text{ XOR } \{0,Z_{bin}[n:1]\}.$$

7. A Gray Code counter comprising:

first translator logic which receives at an input a Gray Code number, $I_{gray}[n:0]$ which the first translator translates into a binary number, $I_{bin}[n:0]$;

binary decrementing logic which decrements the binary number $I_{bin}[n:0]$ to produce a decremented binary number, $Z_{bin}[n:0]$;

second translator logic which translates the decremented binary number $Z_{bin}[n:0]$ into a decremented Gray Code number, $Z_{gray}[n:0]$; and, clocked storage device, coupled to the second translator logic, which stores the decremented Gray Code number, $Z_{gray}[n:0]$, the clocked storage device feeding the decremented Gray Code number, $Z_{gray}[n:0]$, to the input of the first translator logic.

8. A Gray Code counter as in claim 7 wherein the clocked storage device is implemented using a plurality of D flip-flops.

9. A Gray Code counter as in claim 7 wherein the first translator logic translates the Gray Code number $I_{gray}[n:0]$ into the binary number $I_{bin}[n:0]$ according to the following logic algorithm:

$$I_{bin}[n:0]=I_{gray}[n:0] \text{ XOR } \{0,I_{bin}[n:1]\}.$$

10. A Gray Code counter as in claim 7 wherein the second translator logic translates the decremented binary number $Z_{bin}[n:0]$ into the decremented Gray Code number $Z_{gray}[n:0]$ according to the following logic algorithm:

$$Z_{gray}[n:0]=Z_{bin}[n:0] \text{ XOR } \{0,Z_{bin}[n:1]\}.$$

11. A method by which a Gray Code counter is implemented, the method comprising the following steps:

(a) during a first clock cycle, translating a Gray Code number, $I_{gray}[n:0]$, into a binary number, $I_{bin}[n:0]$;

(b) incrementing the binary number $I_{bin}[n:0]$ to produce an incremented binary number, $Z_{bin}[n:0]$;

(c) translating the incremented binary number $Z_{bin}[n:0]$ into an incremented Gray Code number, $Z_{gray}[n:0]$; and, (d) using incremented Gray Code number, $Z_{gray}[n:0]$, as the Gray Code number $I_{gray}[n:0]$ during a next clock cycle.

12. A method as in claim 11 wherein concurrent to step (d) the incremented Gray Code number, $Z_{gray}[n:0]$ is stored using a plurality of D flip-flops.

13. A method as in claim 11 wherein step (a) includes translating the Gray Code number $I_{gray}[n:0]$ into the binary number $I_{bin}[n:0]$ according to the following logic algorithm:

$I_{bin}[n:0] = I_{gray}[n:0] \text{ XOR } \{0, I_{bin}[n:1]\}.$

14. A method as in claim 11 wherein step (c) includes translating the incremented binary number $Z_{bin}[n:0]$ into the incremented Gray Code number $Z_{gray}[n:0]$ according to the following logic algorithm:

$Z_{gray}[n:0] = Z_{bin}[n:0] \text{ XOR } \{0, Z_{bin}[n:1]\}.$

15. A method by which a Gray Code counter is implemented, the method comprising the following steps:

(a) during a first clock cycle, translating a Gray Code number, $I_{gray}[n:0]$, into a binary number, $I_{bin}[n:0]$;

(b) decrementing the binary number $I_{bin}[n:0]$ to produce a decremented binary number, $Z_{bin}[n:0]$;

(c) translating the decremented binary number $Z_{bin}[n:0]$ into a decremented Gray Code number, $Z_{gray}[n:0]$; and, (d) using the decremented Gray Code number, $Z_{gray}[n:0]$, as the Gray Code number $I_{gray}[n:0]$ during a next clock cycle.

16. A method as in claim 15 wherein concurrent with step (d) the decremented Gray Code number, $Z_{gray}[n:0]$ is stored using a plurality of D flip-flops.

17. A method as in claim 15 wherein step (a) includes translating the Gray Code number $I_{gray}[n:0]$ into the binary number $I_{bin}[n:0]$ according to the following logic algorithm:

$I_{bin}[n:0] = I_{gray}[n:0] \text{ XOR } \{0, I_{bin}[n:1]\}.$

18. A method as in claim 15 wherein step (c) includes translating the decremented binary number $Z_{bin}[n:0]$ into the decremented Gray Code number $Z_{gray}[n:0]$ according to the following logic algorithm:

$Z_{gray}[n:0] = Z_{bin}[n:0] \text{ XOR } \{0, Z_{bin}[n:1]\}.$

* * * * *